(12) United States Patent
Abe et al.

(10) Patent No.: US 7,851,833 B2
(45) Date of Patent: Dec. 14, 2010

(54) SEMICONDUCTOR DEVICE

(75) Inventors: Kazuhide Abe, Kawasaki (JP); Tadahiro Sasaki, Tokyo (JP); Kazuhiko Itaya, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 74 days.

(21) Appl. No.: 12/409,926

(22) Filed: Mar. 24, 2009

(65) Prior Publication Data

US 2009/0243725 A1    Oct. 1, 2009

(30) Foreign Application Priority Data

Mar. 25, 2008    (JP) .............................. 2008-078733

(51) Int. Cl.
*H01L 29/76*    (2006.01)
(52) U.S. Cl. ................. 257/288; 257/368; 257/390; 257/401; 257/405
(58) Field of Classification Search .......... 257/E25.002, 257/E25.005, 288, 368, 390, 401, 405
See application file for complete search history.

(56) References Cited

U.S. PATENT DOCUMENTS 7,508,268 B2    3/2009    Sasaki et al.

| | | | |
|---|---|---|---|
| 2005/0121790 A1 * | 6/2005 | Cleeves et al. | ............... 257/758 |
| 2008/0061871 A1 | 3/2008 | Abe et al. | |
| 2008/0258815 A1 | 10/2008 | Abe et al. | |
| 2009/0134430 A1 | 5/2009 | Abe et al. | |

FOREIGN PATENT DOCUMENTS

| JP | 2005-86120 | 3/2005 |
|---|---|---|
| JP | 2007-60616 | 3/2007 |

* cited by examiner

*Primary Examiner*—Michael B Shingleton
(74) *Attorney, Agent, or Firm*—Oblon, Spivak, McClelland, Maier & Neustadt, L.L.P.

(57) ABSTRACT

A semiconductor device includes a first transistor unit including first field effect transistors with first gate electrodes electrically connected together, first sources electrically connected together, and first drains electrically connected together, the first gate electrodes being electrically connected to the first drains, a second transistor unit including second field effect transistors with second gate electrodes electrically connected together, second sources electrically connected together, and second drains electrically connected together, the second gate electrodes being electrically connected to the first gate electrodes, and dummy gate electrodes electrically isolated from the first gate electrodes and the second gate electrodes. The first gate electrodes, the second gate electrodes, and the dummy gate electrodes are arranged parallel to one another, and at least one dummy gate electrode is located between any one of the first gate electrodes and any one of the second gate electrodes.

13 Claims, 5 Drawing Sheets

SEMICONDUCTOR DEVICE

CROSS-REFERENCE TO RELATED APPLICATIONS

This application is based upon and claims the benefit of priority from prior Japanese Patent Application No. 2008-078733, filed Mar. 25, 2008, the entire contents of which are incorporated herein by reference.

BACKGROUND OF THE INVENTION

1. Field of the Invention

The present invention relates to semiconductor devices.

2. Description of the Related Art

In recent years, it has been proposed that CMOS transistor circuits are used for high-frequency power amplifiers in transmission section of portable wireless terminals (see JP-A 2007-60616 (KOKAI)). CMOS transistors used for the integrated circuits are produced by micro-processes and thus have low breakdown voltage. Thus, large current conduction is necessary in order to output high power. To obtain large output current, a structure has been proposed in which a plurality of transistors are arranged in the same device region and connected together in parallel. In this case, a layout configuration called a multi-finger structure is widely used. In the multi-finger layout structure, a plurality of gate electrodes arranged parallel to one another and electrically connected together are arranged on the same device region.

However, in an amplification circuit using CMOS transistors with the multi-finger layout structure, the amplitude exhibiting linearity between an input signal and an output signal is limited. Thus, with this layout structure, providing a high-performance power amplifier with high linearity has conventionally been difficult.

BRIEF SUMMARY OF THE INVENTION

According to an aspect of the present invention, there is provided a semiconductor device comprising: a first transistor unit including a plurality of first field effect transistors with a plurality of first gate electrodes electrically connected together, a plurality of first sources electrically connected together, and a plurality of first drains electrically connected together, the first gate electrodes being electrically connected to the first drains; a second transistor unit including a plurality of second field effect transistors with a plurality of second gate electrodes electrically connected together, a plurality of second sources electrically connected together, and a plurality of second drains electrically connected together, the second gate electrodes being electrically connected to the first gate electrodes; and a plurality of dummy gate electrodes electrically isolated from the first gate electrodes and the second gate electrodes, wherein the first gate electrodes, the second gate electrodes, and the dummy gate electrodes are arranged parallel to one another, and at least one dummy gate electrode is located between any one of the first gate electrodes and any one of the second gate electrodes.

DETAILED DESCRIPTION OF THE INVENTION

Embodiments of the present invention will be described below with reference to the drawings.

Embodiment 1

Figure 1:
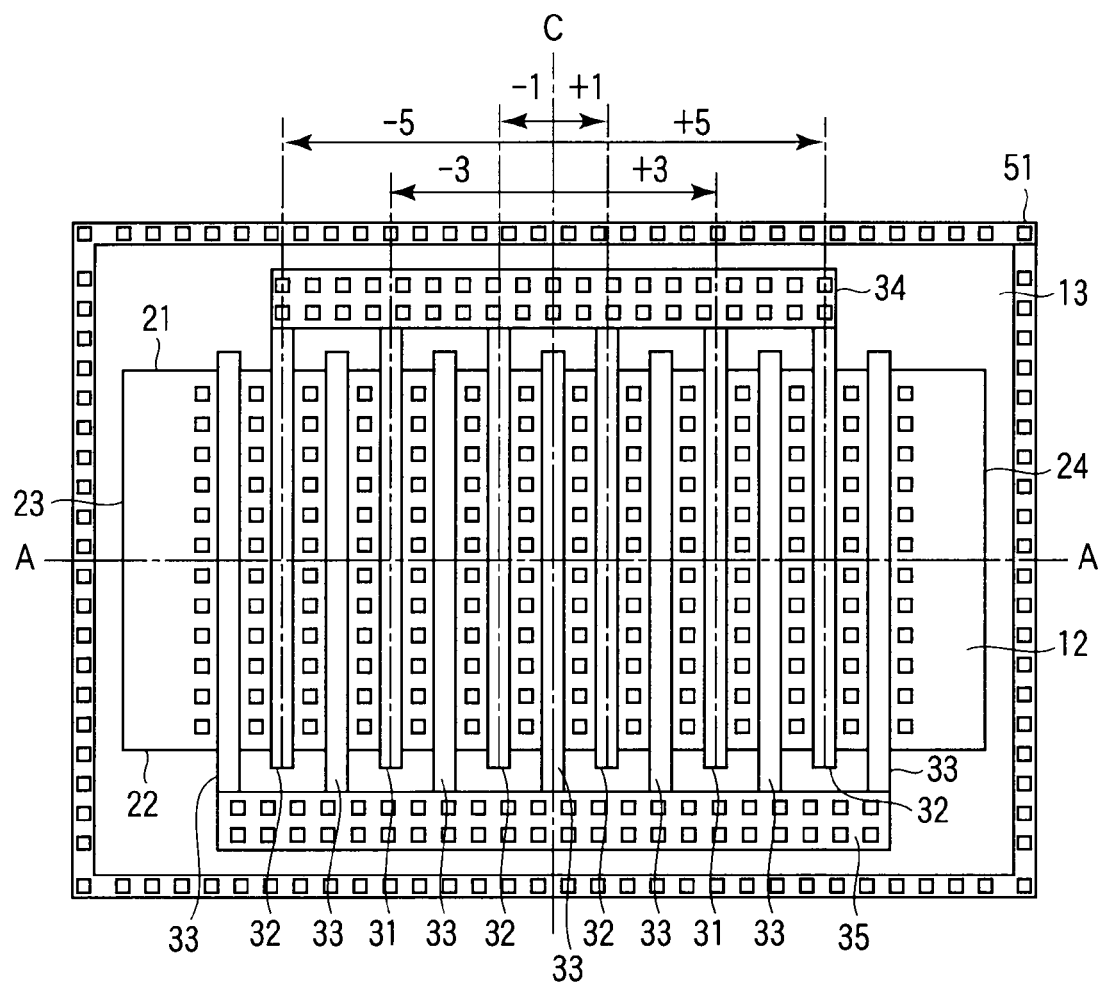
FIG. 1 is a diagram schematically showing a planar configuration of a semiconductor device according to a first embodiment of the present invention.
Figure 2:
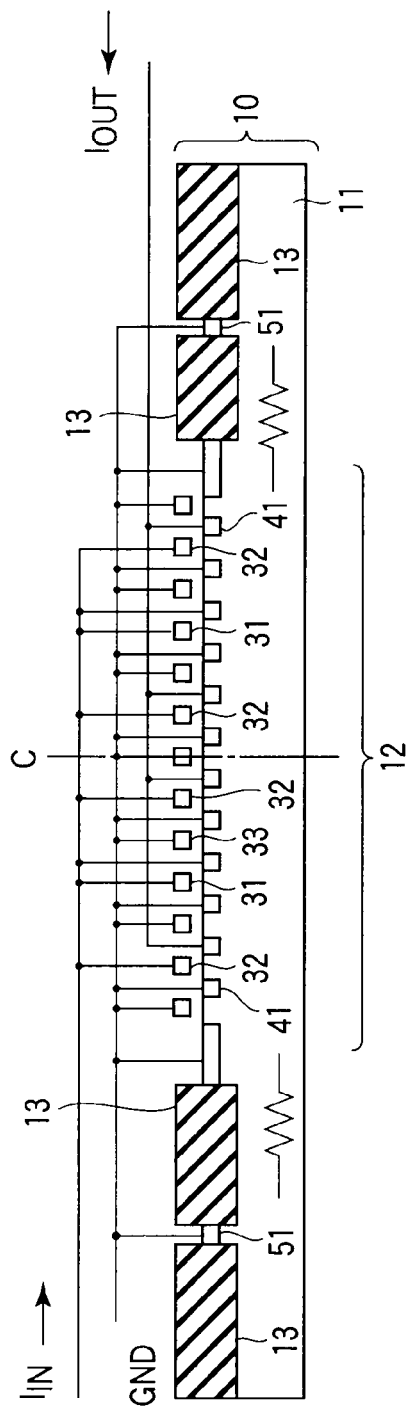
FIG. 2 is a diagram schematically showing a sectional configuration of the semiconductor device according to the first embodiment of the present invention.

FIG. 1 is a diagram schematically showing a planar configuration of a semiconductor device (high-frequency power amplifier) according to a first embodiment of the present invention. FIG. 2 is a diagram schematically showing a sectional configuration of the semiconductor device taken along line A-A in FIG. 1. The semiconductor device (high-frequency power amplifier) shown in FIGS. 1 and 2 has a multi-finger layout structure.

As shown in FIG. 1, an device region 12 is provided on a semiconductor substrate (silicon substrate) 11. The device region 12 is surrounded by an isolation region 13 formed of an insulating film. The planar shape of the device region 12 is a polygon defined by a plurality of sides. In the present embodiment, the planar shape of the device region 12 is a rectangle defined by four sides (edges) 21 to 24.

A plurality of gate electrodes 31, 32, and 33 are formed, via a gate insulating film (not shown in the drawings), on the substrate 10, including the device region 12 and the isolation region 13. The gate electrodes 31 are the first gate electrodes of the first field effect transistor. The gate electrodes 32 are the second gate electrodes of the second field effect transistor. The gate electrodes 33 are dummy gate electrodes. The gate electrodes 31, 32, and 33 are arranged in one direction and parallel to one another. The gate electrodes 31, 32, and 33 are arranged at the same pitch. The gate electrodes 31, 32, and 33 have an equal electrode width W and an equal electrode length L. All the gate electrodes 31, 32, and 33 traverse the device region 12. Each of the dummy gate electrodes 33 is located between one of the first gate electrodes 31 and one of the second gate electrodes 32 which are arranged adjacent to each other, or located between the second gate electrodes 32 arranged adjacent to each other.

Source/drain diffusion regions 41 are formed in a surface of the device region 12. The diffusion regions 41 are formed by ion implanting an impurity element using the gate electrodes 31, 32, and 33 as a mask.

The first gate electrodes 31 of the first field effect transistors are electrically connected together. Sources of the first field effect transistors are also electrically connected together. Drains of the first field effect transistors are also electrically connected together. Thus, a plurality of the first field effect transistors are connected together in parallel. The first field effect transistors make up a first transistor unit.

The second gate electrodes 32 of the second field effect transistors are electrically connected together. Sources of the second field effect transistors are also electrically connected together. Drains of the second field effect transistors are also electrically connected together. Thus, a plurality of the second field effect transistors are connected together in parallel. The second field effect transistors make up a second transistor unit.

As seen in FIGS. 1 and 2, the first and second transistor units are formed in the same device region 12.

The gate electrodes 31 of the first field effect transistors and the gate electrodes 32 of the second field effect transistors are electrically connected together via a common electrode 34 provided outside the device region 12. The drains of the first field effect transistors are electrically connected to the gate electrodes 31 and 32 of the first and second field effect transistors via drain contacts provided on the diffusion regions and contacts provided on the common electrode 34. A signal (input current $I_{IN}$) is input into the gate electrodes 31 and 32 of the first and second field effect transistors and the drains of the first field effect transistors. The drains of the second field effect transistors output a signal (output current $I_{OUT}$) via the drain contacts provided on the diffusion region. The sources of the first and second field effect transistors are connected to a ground potential via a source contacts provided on the diffusion region and substrate contacts 51 provided in the isolation region 13. The dummy gate electrodes 33 are electrically connected together via a common electrode 35 provided outside the device region 12. Each of the dummy gate electrodes 33 is electrically isolated from the gate electrodes 31 and 32. The dummy gate electrodes 33 are connected to the ground potential via contacts provided on the common electrode 35.

Figure 3:
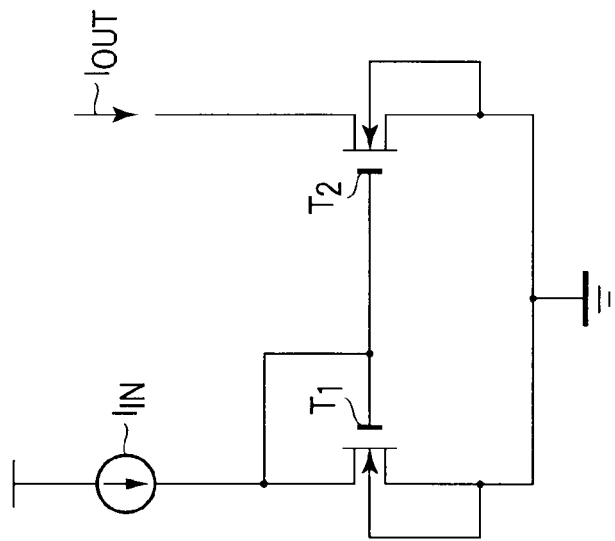
FIG. 3 is a diagram showing an equivalent circuit of a high-frequency power amplifier according to the first embodiment, a second embodiment, and a third embodiment of the present invention.

FIG. 3 shows an equivalent circuit of the high-frequency power amplifier shown in FIGS. 1 and 2. As described above, a plurality of the first field effect transistors make up the first transistor unit $T_1$. A plurality of the second field effect transistors make up the second transistor unit $T_2$. The input current signal $I_{IN}$ is input into the gate electrode of the first transistor unit $T_1$, the gate electrode of the second transistor unit $T_2$, and the drain of the first transistor unit $T_1$. The drain of the second transistor unit $T_2$ outputs the output current signal $I_{OUT}$. A circuit shown in FIG. 3 functions as a current mirror circuit.

In general, a current $I_D$ flowing between the drain and source of the field effect transistor is given by:

$$I_D = (W/2L)\mu C_{ox}(V_{GS}-V_{TH})^2 \quad (1)$$

where L denotes the gate length of the field effect transistor, and W denotes the gate width of the field effect transistor. Furthermore, $\mu$ denotes carrier mobility and $C_{OX}$ denotes the capacitance of the gate insulating oxide film. Additionally, $V_{GS}$ denotes a gate voltage (the voltage between the gate and source), and $V_{TH}$ denotes the threshold voltage for the field effect transistor.

For the current mirror circuit shown in FIG. 3, the following relationship holds true between the input current signal $I_{IN}$ and the output current signal $I_{OUT}$.

$$I_{out} = \{(M_2 W_2/L_2)/(M_1 W_1/L_1)\} I_{IN} \quad (2)$$

In Formula (2), $L_1$ and $L_2$ denote the gate lengths of the first and second field effect transistors, respectively, and $W_1$ and $W_2$ denote the gate widths of the first and second field effect transistors, respectively (the gate width per transistor). Furthermore, $M_1$ and $M_2$ denote the number of gate electrodes in the first and second field effect transistors, respectively. In the present embodiment, the first and second field effect transistors have an equal gate length and an equal gate width. Thus, Formula (2) is expressed as follows.

$$I_{OUT} = (M_2/M_1) I_{IN} \quad (3)$$

In the present embodiment, the number $M_1$ of gate electrodes 31 in the first field effect transistor is 2. The number $M_2$ of gate electrodes 32 in the second field effect transistor is 4. Consequently, current gain is 2. Thus, by setting the number of the gate electrodes 32 in the second field effect transistor to be greater than that of the gate electrodes 31 in the first field effect transistor, the amplified signal can be output by the second transistor unit.

As understood from the above description, even with a nonlinear relationship between a gate-source voltage $V_{GS}$ and a drain current $I_D$ in each transistor as shown in Formula (1), configuring the transistors into such a current mirror circuit as shown in FIG. 3 enables a linear relationship to be established between the input current signal $I_{IN}$ and the output current signal $I_{OUT}$.

To establish the linear relationship between the input current and the output current as shown in Formula (2) or (3), each of the two transistors making up the current mirror circuit needs to satisfy the relationship shown in Formula (1). However, in actuality, even when transistors having the same gate electrode size (length L and width W) are manufactured by the same process under the same conditions, the transistors do not always offer the equal gate-source voltage $V_{GS}$ or the equal threshold voltage $V_{TH}$ (see JP-A 2005-86120 (KO-KAI)). That is, allowing the two transistors (first and second transistor units) to exhibit similar characteristics is generally difficult because of, for example, a variation in characteristics caused by heat from the transistor.

In the present embodiment, such a configuration as shown in FIGS. 1 and 2 is used to enable the two transistors (first and second transistor units) to exhibit similar characteristics. Thus, a high-performance power amplifier with high linearity can be obtained. This will be described below.

When the transistors are densely arranged, diffusing heat generated by the transistors into an environment is difficult. That is, a small interval between the adjacent transistors hinders heat generated by the transistors from being diffused into the environment. Thus, in particular, in a multi-finger layout structure in which a plurality of gate electrodes is arranged in the same device region, a significant difference in temperature occurs between the central transistor and the peripheral transistor. As a result, the transistor characteristics of the central transistor are significantly different from those of the peripheral transistor. As a result, making the transistor characteristics uniform among the transistors is difficult.

To avoid the above-described problem, the interval spacing between the adjacent transistors may be increased. However, in the multi-finger layout structure, a source/drain diffusion region is present between the adjacent transistors. Thus, increasing the interval spacing between the adjacent transistors increases the area of the diffusion region. As a result, parasitic capacitance associated with the diffusion region increases, significantly preventing increase in the operation speed of the transistors.

In the present embodiment, the dummy gates are provided between the adjacent transistors. Thus, the area of the diffusion region can be reduced in spite of an increase in the interval spacing between the adjacent transistors. Furthermore, current can be prevented from flowing through the dummy transistors, which are based on dummy gate electrodes (for example, the dummy gate electrodes are set to a ground potential). The dummy transistors are thus inhibited from posing the heating problem. Therefore, the present embodiment can inhibit possible nonuniform transistor characteristics caused by heat and prevent a possible increase in parasitic capacitance, enabling a semiconductor device with excellent characteristics to be obtained. That is, a high-performance power amplifier with high linearity can be obtained.

In connection with the nonuniform transistor characteristics, the nonuniform threshold voltage $V_{TH}$ of the transistors will be described.

The threshold voltage $V_{TH}$ is affected by a variation in the substrate potential of the transistor. The variation in substrate potential occurs as follows. When electrons in a channel of a transistor are accelerated by electric field and collide against crystal lattices, an impact ionization phenomenon occurs, newly generating pairs of an electron and a hole. Some of the electrons and holes thus generated are scattered from the channel and migrate toward the substrate. Thus, the substrate potential varies. A cause of the collision of the electrons against the crystal lattices is disturbance of periodicity of the crystals. A more specific cause is the presence of impurities, crystal defects, lattice vibration (phonons), or the like. A rise in the temperature of the channel activates the lattice vibration. Thus, a rise in the temperature of the channel increases the frequency of collisions of the electrons. A variation in substrate potential varies the threshold voltage of the transistor. Consequently, a difference in temperature between the two transistors making up the current mirror circuit leads to a difference in threshold voltage $V_{TH}$ between the two transistors. Thus, $V_{TH}$ in Formula (1) varies between the two transistors, preventing Formulae (2) and (3) from holding true.

The above-described configuration of the present embodiment enables inhibition of a nonuniform rise in temperature between the two transistors making up the current mirror circuit. Thus, a possible variation in the threshold voltage $V_{TH}$ can be made uniform between the two transistors making up the current mirror circuit. Therefore, preconditions for Formulae (2) and (3) can be met, enabling a high-performance power amplifier with high linearity to be obtained.

Furthermore, in the present embodiment, both the gate electrodes 31 and 32 of the first and second field effect transistors are connected to the common electrode 34, provided in the vicinity of the gate electrodes 31 and 32. Thus, the potentials of the gate electrodes 31 and 32 can be set to almost the same value with adverse effects of the parasitic capacitance substantially avoided. Additionally, both the sources of the first and second field effect transistors are connected to the ground potential via the substrate contact 51, provided in the vicinity of the device region 12. Thus, the source potentials of the first and second field effect transistors can be set to almost the same value with adverse effects of the parasitic resistance substantially avoided.

Consequently, the gate-source voltages $V_{GS}$ of the two transistors can be set to almost the same value. This allows the two transistors to exhibit similar characteristics, enabling a high-performance power amplifier with high linearity to be obtained.

Furthermore, in the present embodiment, the position of the center of gravity of the first gate electrode 31 aligns with that of the second gate electrode 32. This will be described below. A coordinate axis is defined for a direction in which the gate electrodes 31, 32, and 33 are arranged. Then, a position C in FIG. 1 is defined as the origin of coordinates. In this case, the first gate electrode 31 is present at coordinate positions of "+3" and "−3". Thus, for the first gate electrode 31, the origin of coordinates C is the center of gravity. The second gate electrode 32 is present at coordinate positions of "+1", "−1", "+5", and "−5". Thus, also for the second gate electrode 32, the origin of coordinates C is the center of gravity. That is, the position of the center of gravity of the first gate electrode 31 aligns with that of the second gate electrode 32.

In the above-described example, the position of the center of gravity of the first gate electrode 31 aligns with that of the second gate electrode 32. However, alternatively, the coordinate axis may be defined for the direction in which the first gate electrodes 31, the second gate electrodes 32, and the dummy gate electrodes 33 are arranged, and for example, the central portion of the device region 12 may be defined as an origin of coordinates. Then, the absolute value of the sum of the coordinates of the first gate electrodes 31 may be set to be equal to that of the second gate electrode 32. In short, the absolute value of the coordinate of the position of the center of gravity of the first gate electrodes 31 may be set to be equal to that of the second gate electrode 32.

When the first gate electrodes 31, the second gate electrodes 32, and the dummy gate electrodes 33 are arranged on the device region 12, heat from the transistors may result in a distribution of temperatures in the direction in which the first gate electrodes 31, the second gate electrodes 32, and the dummy gate electrodes 33 are arranged. The temperature normally lowers from the central portion (origin of coordinates) toward peripheral portions of the device region 12. Thus, by arranging the first gate electrodes 31 and the second gate electrodes 32 so that the absolute value of the coordinate of the position of the center of gravity of the first gate electrodes 31 is equal to that of the second gate electrodes 32, the level of the effect of the temperature distribution on the first gate electrode 31 can be set to be almost equivalent to that on the second gate electrode 32. That is, the level of the effect of the temperature distribution on the whole first field effect transistor can be set to be almost equivalent to that on the whole second field effect transistor. This allows the two transistor units to exhibit similar characteristics, enabling a high-performance power amplifier with high linearity to be obtained.

In view of various variation factors affecting the transistor characteristics, the first gate electrodes 31 and the second gate electrodes 32 are more desirably arranged such that the position of the center of gravity of the first gate electrodes 31 aligns with that of the second gate electrodes 32. That is, the first gate electrodes 31 and the second gate electrodes 32 are more desirably arranged such that the sum of the coordinates of the first gate electrodes 31 is equal to that of the second gate electrodes 32. For example, the threshold voltage $V_{TH}$ may be varied by a variation in the concentration of impurities. In this case, by arranging the first gate electrodes 31 and the second gate electrodes 32 so that the position of the center of gravity of the first gate electrodes 31 aligns with that of the second gate electrodes 32, the level of the effect of the variation in threshold on the whole first field effect transistor can be set to be almost equivalent to that on the whole second field effect transistor. This allows the two transistor units to exhibit similar characteristics, enabling a high-performance power amplifier with high linearity to be obtained.

Furthermore, according to the present embodiment, as shown in FIG. 2, in both the first and second field effect transistors, the source is located on the left side of the gate electrode. The drain is located on the right side of the gate electrode. This enables inhibition of the adverse effect of the variation in threshold voltage $V_{TH}$, which depends on the ion implantation angle of impurities. This in turn allows the two transistor units to exhibit similar characteristics, enabling a high-performance power amplifier with high linearity to be obtained.

Embodiment 2

Figure 4:
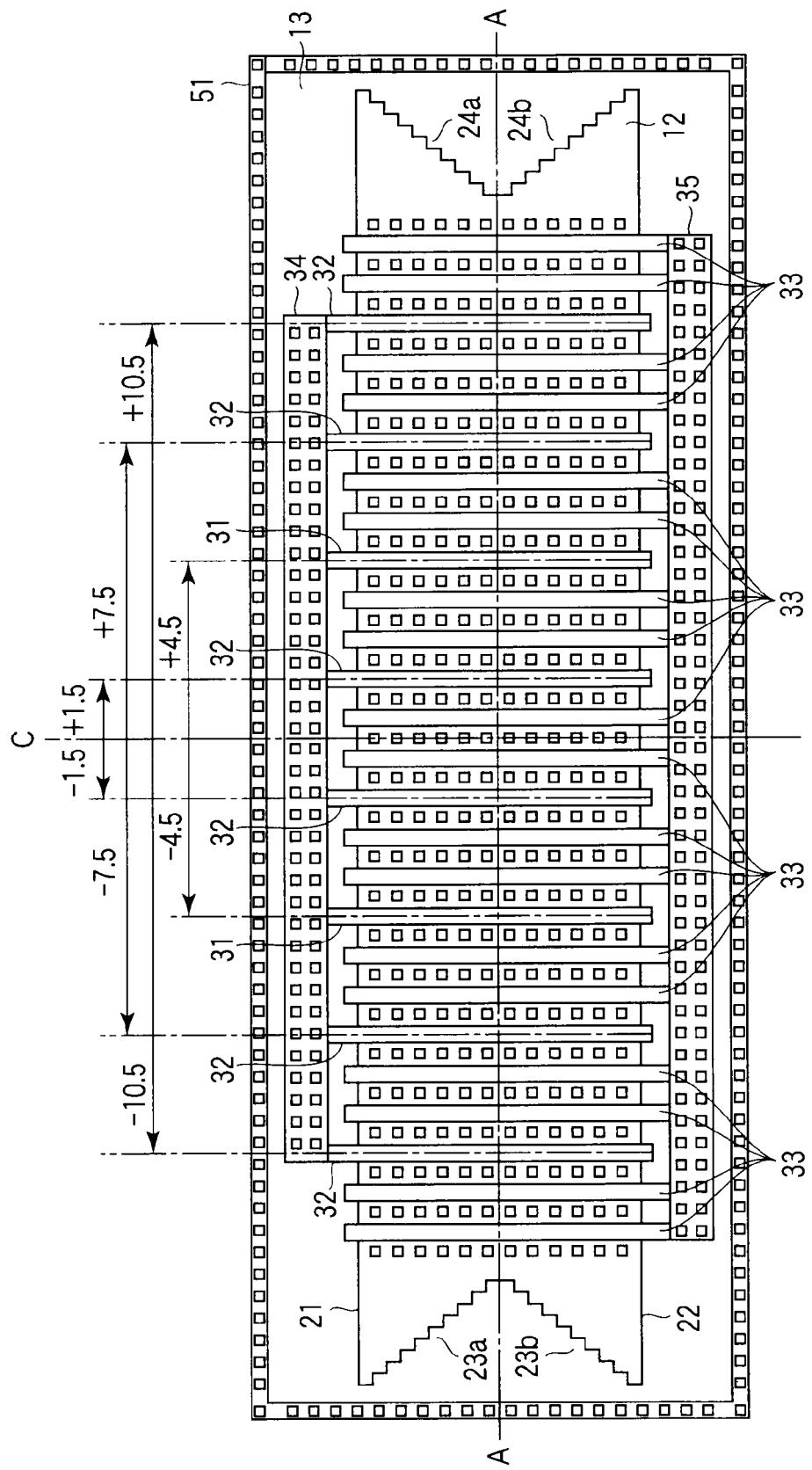
FIG. 4 is a diagram schematically showing a planar configuration of a semiconductor device according to the second embodiment of the present invention.
Figure 5:
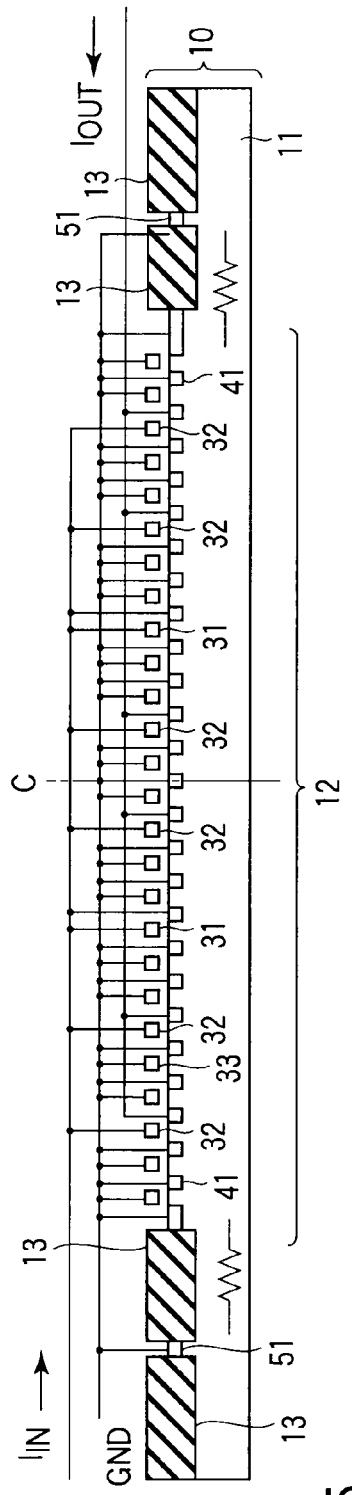
FIG. 5 is a diagram schematically showing a sectional configuration of the semiconductor device according to the second embodiment of the present invention.

FIG. 4 is a diagram schematically showing a planar configuration of a semiconductor device (high-frequency power amplifier) according to the second embodiment of the present invention. FIG. 5 is a diagram schematically showing a sectional configuration of the semiconductor device taken along line A-A in FIG. 4. The semiconductor device (high-frequency power amplifier) shown in FIGS. 4 and 5 has a multi-finger layout structure.

The basic configuration of the present embodiment is similar to that of the first embodiment, and the present embodiment can exert effects similar to those described in the first embodiment. Thus, matters described in the first embodiment will not be described below. An equivalent circuit of the present embodiment is also the same as that of the first embodiment, shown in FIG. 3.

In the present embodiment, some pairs of dummy gate electrodes 33 are arranged between the first gate electrode 31 and second gate electrode 32 which are arranged adjacent to each other. The other pairs of dummy gate electrodes 33 are also arranged between the second gate electrodes 32 arranged adjacent to each other. Thus, the increased number of dummy electrodes 33 enables an increase in the interval spacing between the active gate electrodes (first gate electrode 31 and second gate electrode 32). This allows reliable inhibition of possible nonuniform transistor characteristics resulting from heat. Therefore, a high-performance power amplifier with high linearity can be obtained.

When an acoustic standing wave (phonons) is excited in the device region, the phonons disturb the periodicity of the crystals. This increases the frequency with which the electrons in the channel collide against the crystal lattices. As a result, for a reason similar to that for the rise in temperature described in the first embodiment, the threshold voltage $V_{TH}$ varies. Thus, the excitation of the acoustic standing wave in the device region is a factor degrading the characteristics of the current mirror circuit. When the gate electrodes 31, 32, and 33 are sandwiched between sides (edges of the device region) that are parallel to the gate electrodes 31, 32, and 33, acoustic waves are reflected by the sides, making the standing wave likely to be excited.

In the present embodiment, the planar shape of the device region 12 is a polygon defined by six sides (edges) 21, 22, 23a, 23b, 24a, and 24b. The sides 21 and 22 are parallel to each other and perpendicular to the gate electrodes 31, 32, and 33. On the other hand, the sides 23a, 23b, 24a, and 24b are nonparallel to the gate electrodes 31, 32, and 33. Thus, adoption of such a configuration as shown in FIG. 4 allows effective prevention of the excitation of the acoustic standing wave in the device region. As a result, the characteristics of the current mirror circuit can be prevented from being degraded, enabling a high-performance power amplifier with high linearity to be obtained.

In a practical semiconductor manufacturing process, the sides 23a, 23b, 24a, 24b are formed like steps as shown in FIG. 4. That is, in a strict sense (from a microscopic viewpoint), each of the oblique sides 23a, 23b, 24a, and 24b are composed of a large number of very short sides. However, each of the very short sides is sufficiently shorter than each of the oblique sides 23a, 23b, 24a, and 24b. Thus, from a macroscopic viewpoint, the step-like shape is negligible. That is, the fine step-like shape resulting from a technique for manufacturing a mask pattern is negligible. Consequently, the device region 12 can be considered to be shaped like a hexagon defined by six sides (edges) 21, 22, 23a, 23b, 24a, and 24b.

Generally speaking, the device region according to the present embodiment can be described as follows. That is, the device region is shaped like a polygon defined by a plurality of sides. At least one of the sides crosses none of the first gate electrodes, the second gate electrodes, and the dummy gate electrodes and is nonparallel to the first gate electrodes, the second gate electrodes, and the dummy gate electrodes.

Also in the present embodiment, as shown in FIG. 4, the position of the center of gravity of the first gate electrodes 31 aligns with that of the second gate electrodes 32. Generally speaking, the absolute value of the coordinate of the position of the center of gravity of the first gate electrodes 31 is equal to that of the second gate electrodes 32. Therefore, like the first embodiment, the second embodiment allows the two transistor units to exhibit similar characteristics, enabling a high-performance power amplifier with high linearity to be obtained.

Embodiment 3

Figure 7:
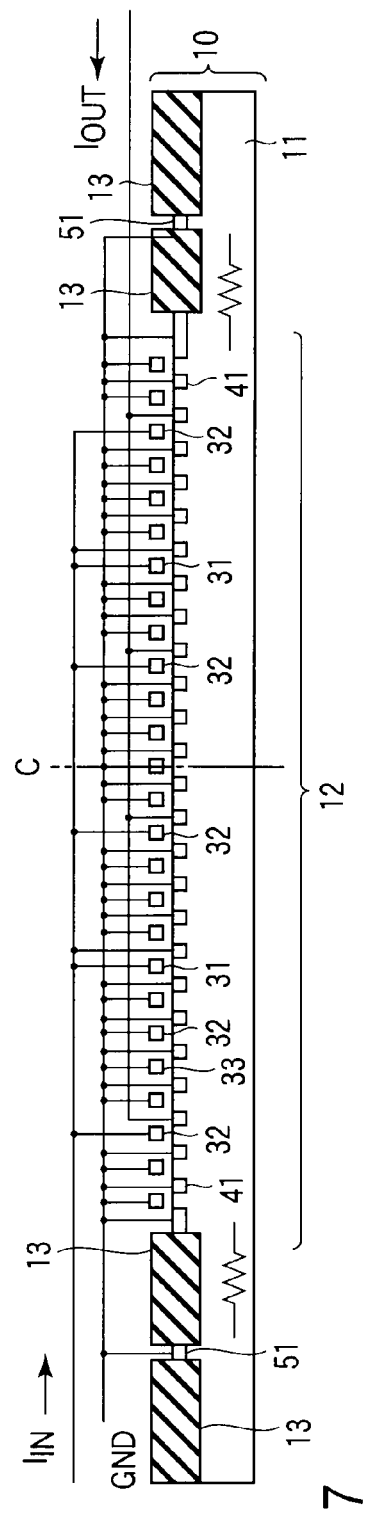
FIG. 7 is a diagram schematically showing a sectional configuration of the semiconductor device according to the third embodiment of the present invention.
Figure 6:
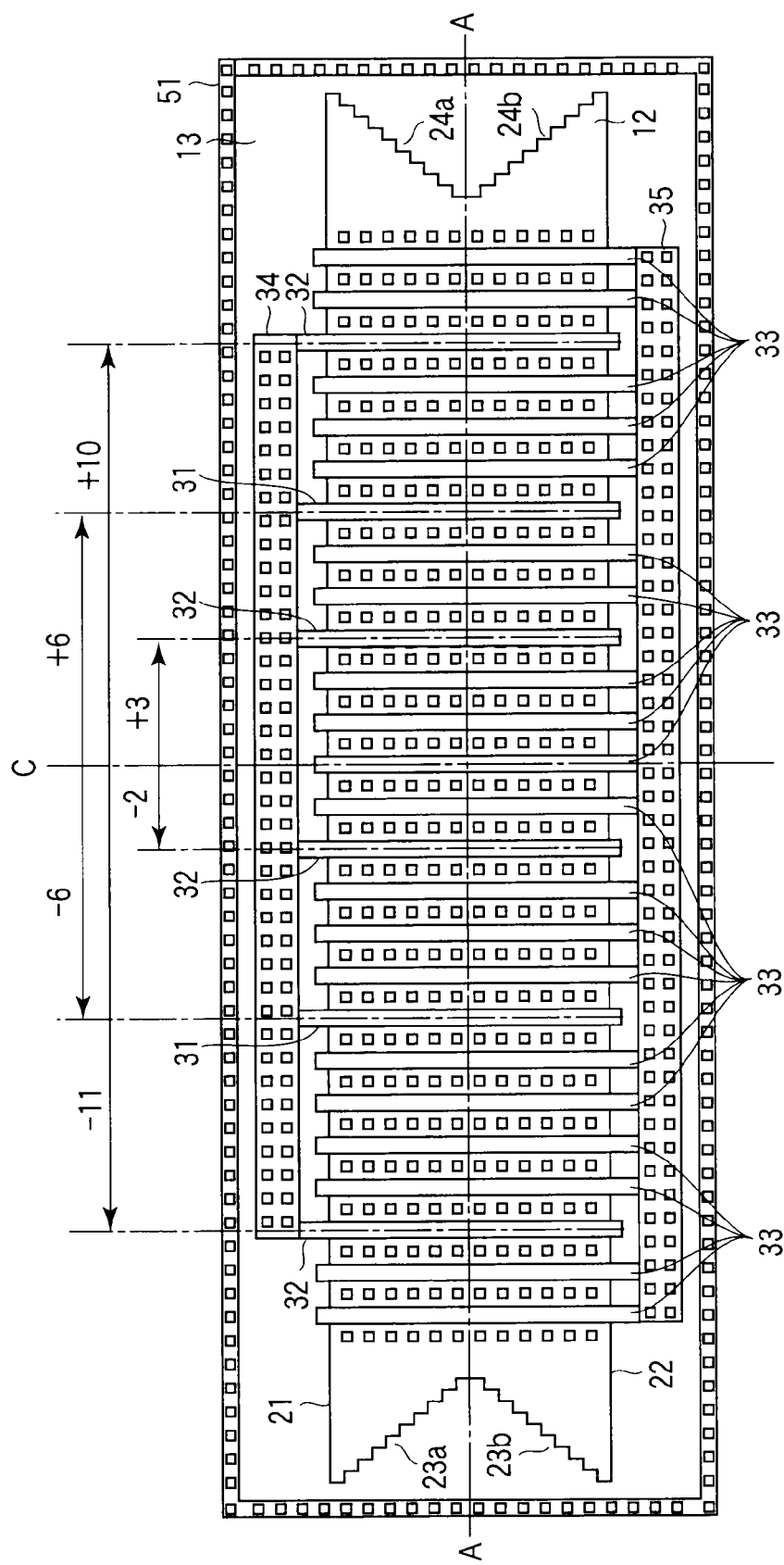
FIG. 6 is a diagram schematically showing a planar configuration of a semiconductor device according to the third embodiment of the present invention.

FIG. 6 is a diagram schematically showing a planar configuration of a semiconductor device (high-frequency power amplifier) according to the third embodiment of the present invention. FIG. 7 is a diagram schematically showing a sectional configuration of the semiconductor device taken along line A-A in FIG. 6. The semiconductor device (high-frequency power amplifier) shown in FIGS. 6 and 7 has a multi-finger layout structure.

The basic configuration of the present embodiment is similar to that of the first embodiment, and the present embodiment can exert effects similar to those described in the first embodiment. Thus, matters described in the first embodiment will not be described below. An equivalent circuit of the present embodiment is also the same as that of the first embodiment, shown in FIG. 3.

In the first and second embodiments, the number of dummy gate electrodes arranged between the active gate electrodes (first gate electrode 31 and second gate electrode 32) is constant. In the present embodiment, the number of dummy gate electrodes arranged between the active gate electrodes varies.

As already described, the excitation of the acoustic standing wave (phonons) in the device region is a factor degrading the characteristics of the current mirror circuit. When the active gate electrodes (first gate electrodes 31 and second gate electrodes 32), used for transistor operations, are arranged at a constant period (at regular intervals), the acoustic standing wave (phonons) based on the constant period is likely to be excited. In the present embodiment, the varying number of dummy gate electrodes arranged between the active gate electrodes makes the acoustic standing wave (phonons) unlikely to be excited. As a result, the characteristics of the current mirror circuit can be prevented from being degraded, enabling a high-performance power amplifier with high linearity to be obtained.

Generally speaking, the configuration of the present embodiment can be described as follows. That is, among the first and second gate electrodes, three consecutively arranged gate electrodes are defined as a left gate electrode, a central gate electrode, and a right gate electrode. Then, the number of dummy gate electrodes arranged between the central gate electrode and the left gate electrode is different from that of dummy gate electrodes arranged between the central gate electrode and the right gate electrode.

Furthermore, in the present embodiment, the planar shape of the device region 12 is a polygon defined by the six sides (edges) 21, 22, 23a, 23b, 24a, and 24b as is the case with the second embodiment. Thus, also in this connection, the acoustic standing wave (phonons) is unlikely to be excited.

Also in the present embodiment, as shown in FIG. 6, the position of the center of gravity of the first gate electrodes 31 aligns with that of the second gate electrodes 32. Generally speaking, the absolute value of the coordinate of the position of the center of gravity of the first gate electrodes 31 is equal to that of the second gate electrodes 32. Therefore, like the first embodiment, the third embodiment allows the two transistor units to exhibit similar characteristics, enabling a high-performance power amplifier with high linearity to be obtained.

The embodiments of the present invention have been described. The matters described above in the embodiments can be appropriately combined with one another.

Furthermore, the structures described above in the embodiments are applicable not only to n-type MOS transistors (n-type MIS transistors) but also to p-type MOS transistors (p-type MIS transistors). The structures described above in the embodiments are also applicable to transistors with Laterally Diffused MOS (LDMOS) structure.

In addition, the structures described above in the embodiments are applicable not only to power amplifiers, but also to the other high-frequency analog circuits such as low-noise amplifiers, voltage-controlled oscillators, mixer, and so on.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device comprising:
    a first transistor unit including a plurality of first field effect transistors with a plurality of first gate electrodes electrically connected together, a plurality of first sources electrically connected together, and a plurality of first drains electrically connected together, the first gate electrodes being electrically connected to the first drains;
    a second transistor unit including a plurality of second field effect transistors with a plurality of second gate electrodes electrically connected together, a plurality of second sources electrically connected together, and a plurality of second drains electrically connected together, the second gate electrodes being electrically connected to the first gate electrodes; and
    a plurality of dummy gate electrodes electrically isolated from the first gate electrodes and the second gate electrodes,
    wherein the first gate electrodes, the second gate electrodes, and the dummy gate electrodes are arranged parallel to one another, and at least one dummy gate electrode is located between any one of the first gate electrodes and any one of the second gate electrodes.

2. The semiconductor device according to claim 1, wherein the first gate electrodes, the second gate electrodes, and the dummy gate electrodes are arranged at the same pitch.

3. The semiconductor device according to claim 1, wherein the first gate electrodes, the second gate electrodes, and the dummy gate electrodes have the same electrode width and the same electrode length.

4. The semiconductor device according to claim 1, wherein number of the second gate electrodes is greater than that of the first gate electrodes.

5. The semiconductor device according to claim 1, wherein the first transistor unit and the second transistor unit are provided in the same device region.

6. The semiconductor device according to claim 5, wherein the first gate electrodes, the second gate electrodes, and the dummy gate electrodes traverse the device region.

7. The semiconductor device according to claim 6, wherein the device region is shaped like a polygon defined by a plurality of sides, and
    at least one of the sides crosses none of the first gate electrodes, the second gate electrodes, and the dummy gate electrodes and is nonparallel to the first gate electrodes, the second gate electrodes, and the dummy gate electrodes.

8. The semiconductor device according to claim 1, wherein a signal is input to the first transistor unit, and the second transistor unit outputs an amplified signal.

9. The semiconductor device according to claim 1, wherein the first transistor unit and the second transistor unit make up a current mirror circuit.

10. The semiconductor device according to claim 1, wherein the dummy gate electrodes are set at a constant potential.

11. The semiconductor device according to claim 1, wherein at least one of the dummy gate electrodes is located between adjacent second gate electrodes.

12. The semiconductor device according to claim 1, wherein when three consecutively arranged ones of the first and second gate electrodes are defined as a left gate electrode, a central gate electrode, and a right gate electrode,
    number of dummy gate electrodes arranged between the central gate electrode and the left gate electrode is different from that of dummy gate electrodes arranged between the central gate electrode and the right gate electrode.

13. The semiconductor device according to claim 1, wherein when a coordinate axis is defined for a direction in which the first gate electrodes, the second gate electrodes, and the dummy gate electrodes are arranged, an absolute value of sum of coordinates of the first gate electrodes is equal to that of the second gate electrodes.

* * * * *